United States Patent
Gardner et al.

[11] Patent Number: 5,885,877
[45] Date of Patent: Mar. 23, 1999

[54] COMPOSITE GATE ELECTRODE INCORPORATING DOPANT DIFFUSION-RETARDING BARRIER LAYER ADJACENT TO UNDERLYING GATE DIELECTRIC

[75] Inventors: Mark I. Gardner, Cedar Creek; Robert Dawson, Austin; H. Jim Fulford, Jr., Austin; Frederick N. Hause, Austin; Daniel Kadosh, Austin; Mark W. Michael, Cedar Park; Bradley T. Moore; Derick J. Wristers, both of Austin, all of Tex.

[73] Assignee: Advanced Micro Devices, Inc., Sunnyvale, Calif.

[21] Appl. No.: 837,581

[22] Filed: Apr. 21, 1997

[51] Int. Cl.$^6$ ...................... H01L 21/336; H01L 21/3205
[52] U.S. Cl. ........................... 438/300; 438/303; 438/593
[58] Field of Search .................................. 438/592, 593, 438/300–305

[56] References Cited

U.S. PATENT DOCUMENTS

| | | | |
|---|---|---|---|
| 4,369,072 | 1/1983 | Bakeman, Jr. et al. | 148/1.5 |
| 4,420,872 | 12/1983 | Solo De Zaldivar | 29/571 |
| 4,481,527 | 11/1984 | Chen et al. | 357/23 |
| 4,575,921 | 3/1986 | Bhagat | 29/571 |
| 4,597,159 | 7/1986 | Usami et al. | 438/593 |
| 4,774,197 | 9/1988 | Haddad et al. | 437/27 |
| 4,869,781 | 9/1989 | Euen et al. | 156/643 |
| 4,897,368 | 1/1990 | Kobushi et al. | 437/200 |
| 5,518,958 | 5/1996 | Giewont et al. | 438/592 |
| 5,567,638 | 10/1996 | Lin et al. | 438/592 |
| 5,605,848 | 2/1997 | Ngaoaram | 437/24 |

OTHER PUBLICATIONS

Stanley Wolf, *Silicon Processing for the VLSI Era, vol. 3: The Submicron MOSFET,* Lattice Press, Sunset Beach, CA, 1995, pp. 305–313.

H. Sayama et al, "Low Voltage of Sub–Quarter Micron W–Polycide Dual Gate CMOS with Non–Uniformly Doped Channel," *International Electron Devices Meeting Technical Digest,* Dec. 8–11, 1996, San Francisco, CA, pp. 583–586.

(List continued on next page.)

*Primary Examiner*—John F. Niebling
*Assistant Examiner*—Michael S. Lebentritt
*Attorney, Agent, or Firm*—Skjerven, Morrill, MacPherson, Franklin & Friel, L.L.P.; Andrew C. Graham

[57] ABSTRACT

A composite gate electrode layer incorporates a diffusion-retarding barrier layer disposed at the bottom of the gate electrode layer to reduce the amount of dopant which diffuses into the gate dielectric layer from the gate electrode layer. A lower nitrogen-containing gate electrode layer provides a diffusion-retarding barrier layer against dopant diffusion into the gate dielectric layer disposed therebelow, and an upper gate electrode layer is formed upon the lower layer and is doped to form a highly conductive layer. Together the first and second gate electrode layers form a composite gate electrode layer which incorporates a diffusion-retarding barrier layer adjacent to the underlying gate dielectric layer. The barrier layer may be formed by annealing a first polysilicon layer in a nitrogen-containing ambient, such as $N_2$, NO, $N_2O$, and $NH_3$, by implanting a nitrogen-containing material, such as elemental or molecular nitrogen, into a first polysilicon layer, and by in-situ depositing a nitrogen-doped first polysilicon layer. Diffusion of dopants into the gate dielectric layer may be retarded, as most dopant atoms are prevented from diffusing from the composite gate electrode layer at all. In addition, the nitrogen concentration within the gate dielectric layer, particularly at or near the substrate interface, may be maintained at lower concentrations than otherwise necessary to prevent dopant diffusion into the underlying substrate. The present invention is particularly well suited to thin gate dielectrics, such as a those having a thickness less than approximately 60 Å when using a p-type dopant, such as boron.

27 Claims, 4 Drawing Sheets

OTHER PUBLICATIONS

C. T. Liu et al, "High Performance 0.2 μm CMOS with 25 Å Gate Oxide Grown on Nitrogen Implanted Si Subsstrates," *International Electron Devices Meeting Technical Digest,* San Francisco, CA, Dec. 8–11, 1996, pp. 499–502.

C.T. Liu et al., "25 Å Gate Oxide without Boron Penetration for 0.25 and 0.3–μm PMOSFETs," *1996 Symposium on VLSI Technology Digest of Technical Papers,* pp. 18–19.

Hattangady et al., "Ultrathin Nitrogen–Profile Engineered Gate Dielectric Films," *International Electron Devices Meeting 1996,* pp. 495–498 (Dec. 8–11, 1996, San Francisco, CA).

A.B. Joshi et al., "Oxynitride Gate Dielectrics for p$^+$–Polysilicon Gate MOS Devices," *IEEE Electron Devices Letters,* vol. 14, No. 12, pp. 560–562 (Dec. 1993).

H. Fang et al., "Low–Temperature Furnace–Grown Reoxidized Nitrided Oxide Gate Dielectrics as a Barrier to Boron Penetration," *IEEE Electron Device Letters,* vol. 13, No. 4, pp. 217–219 (Apr., 1992).

Chuan Lin et al., "Leakage Current, Reliability Characteristics, and Boron Penetration of Ultra–Thin (32–36Å) $O_2$–Oxides and $N_2O$/NO Oxynitrides," *International Electron Devices Meeting 1996,* pp. 331–334 (Dec. 8–11, 1996—San Francisco, CA).

E. Hasegawa et al., "The Impact of Nitrogen Profile Engineering on Ultra–Thin Nitrided Oxide Films for Dual–Gate CMOS ULSI," *International Electron Devices Meeting 1995,* pp. 327–330 (Dec. 10–13, 1995—Washington, DC).

Hattangady et al., "Controlled Nitrogen Incorporation at the Gate Oxide Surface," *Applied Physics Letters,* vol. 66, No. 25, pp. 3495–3497 (Jun. 19, 1995).

Silicon Processing for the VLSI Era—vol. 1:Process Technology, by S. Wolf, published by Lattice Press, Sunset Beach, CA, 1986, pp. 182–195, 209–211, 280–283, 294, 308, 321–327. (Month Unknown).

Silicon Processing for the VLSI Era—vol. 2:Process Integration, by S. Wolf, published by Lattice Press, Sunset Beach, CA, 1990, pp. 124–131. (Month Unknown).

T. Kuroi et al., "Novel NICE (Nitrogen Implantation into CMOS Gate Electrode and Source–Drain) Structure for High Reliability and High Performance 0.25 μm Dual Gate CMOS," *International Electron Devices Meeting 1993,* pp. 325–328 (Dec. 5–8, 1993—Washington, DC).

Silicon Processing for the VLSI Era—vol. 3: The Submicron MOSFET, by S. Wolf, published by Lattice Press, Sunset Beach, CA, 1995, pp. 496–504, 641–642, and 648–661. (Month Unknown).

COMPOSITE GATE ELECTRODE INCORPORATING DOPANT DIFFUSION-RETARDING BARRIER LAYER ADJACENT TO UNDERLYING GATE DIELECTRIC

CROSS-REFERENCE TO RELATED APPLICATIONS

This patent document is related to the following concurrently-filed, commonly-assigned, copending U.S. patent application, which is incorporated herein by reference in its entirety:

U. S. patent application Ser. No. 08/837,579, entitled "Ion Implantation into a Gate Electrode Layer Using an Implant Profile Displacement Layer," naming as inventors Mark I. Gardner, Robert Dawson, H. Jim Fulford, Jr., Frederick N. Hause, Mark W. Michael, Bradley T. Moore, and Derick J. Wristers.

BACKGROUND OF THE INVENTION

1. Field of the Invention

The present invention is related to the manufacture of insulated gate field effect transistors, and more particularly to the structure and doping of gate electrodes therein.

2. Description of the Related Art

An insulated-gate field-effect transistor (IGFET), such as a metal-oxide semiconductor field-effect transistor (MOSFET), uses a gate electrode to control an underlying surface channel joining a source and a drain. The channel, drain and source are located in a semiconductor substrate, with the channel being doped oppositely to the drain and source. The gate electrode is separated from the semiconductor substrate by a thin insulating layer (i.e., a gate dielectric layer) such as an oxide. The operation of the IGFET involves application of an input voltage to the gate electrode, which sets up a transverse electric field in the channel in order to modulate the longitudinal conductance of the channel.

In typical IGFET processing, the source and drain are formed by introducing dopants of a second conductivity type (P or N) into the semiconductor substrate of a first conductivity type (N or P) using a patterned gate electrode as a mask. This self-aligning procedure tends to improve packing density and reduce parasitic overlap capacitances between the gate electrode and the source/drain regions. Polysilicon (also called polycrystalline silicon, poly-Si, or just "poly") thin films are typically used as the gate electrode. Since polysilicon has the same high melting point as a silicon substrate, it can be deposited prior to source and drain formation. The polysilicon is anisotropically etched through openings in a photoresist mask to provide a gate electrode which forms a mask during formation of the source and drain by ion implantation. Photolithography is used to create patterns in the photoresist mask that define the gate electrode.

The gate electrode is typically doped by the same ion implantation as are the source and drain. For example, boron is frequently implanted to form the source and drain in a P-channel IGFET, and the boron is also implanted into the gate electrode of the IGFET to create a P-type polysilicon gate electrode. However, because boron is such a "light" atom (i.e., low atomic mass), boron implanted into the polysilicon gate electrode can easily diffuse downward along the grain boundaries of the polysilicon and into the gate oxide, and may diffuse ultimately into the underlying channel region. The presence of such boron in the channel affects the device parameters of the IGFET, especially the threshold voltage, and the presence of boron in the gate oxide can affect the reliability of the IGFET. Both effects are tremendously undesirable.

A number of techniques have been utilized to reduce diffusion of dopants, especially boron, into the gate dielectric and into the underlying channel. One such method is disclosed by Fang, et al, in a paper entitled "Low-Temperature Furnace-Grown Reoxidized Nitrided Oxide Gate Dielectrics as a Barrier to Boron Penetration," *IEEE Electron Device Letters*, Vol. 13, No. 4, April, 1992, which includes a nitridation of a partially grown gate oxide, followed by an additional oxidation step. Polysilicon is then deposited on the reoxidized nitrided oxide and etched to form gate electrodes.

Other similar methods are disclosed by Joshi, et al in a paper entitled "Oxynitride Gate Dielectrics for P+-polysilicon Gate MOS Devices," *IEEE Electron Device Letters*, Vol. 14, No. 12, December, 1993, which compares several similar methods of forming oxynitride gate dielectrics.

While such methods are helpful in reducing boron penetration into the channel, the desired gate oxide thickness continues to decrease. The effectiveness of earlier techniques may diminish with decreasing gate oxide thickness. Accordingly, there is a need for improved techniques for reducing dopant penetration (especially boron) into the gate oxide and into the channel region.

SUMMARY OF THE INVENTION

It is an object of the present invention to provide for reduced dopant diffusion from a gate electrode into a gate dielectric layer, while limiting nitrogen concentration within the gate dielectric layer.

It is a further object of the present invention to particularly limit nitrogen concentration at or near the gate dielectric/substrate interface.

It is an additional object of the present invention to form a diffusion-retarding barrier layer disposed at the bottom of the gate electrode layer, to reduce the amount of dopant which diffuses into the gate dielectric layer from the gate electrode.

The present invention improves upon previous techniques for retarding dopant diffusion into the gate dielectric layer by incorporating a composite gate electrode layer: a lower nitrogen-containing gate electrode layer which provides a diffusion-retarding barrier layer against dopant diffusion into the gate dielectric layer disposed therebelow, and an upper gate electrode layer which is formed upon the lower layer and which is doped to form a highly conductive layer. Together the first and second gate electrode layers form a composite gate electrode layer which incorporates a diffusion-retarding barrier layer therewithin and adjacent to the underlying gate dielectric layer.

The barrier layer may be formed, in one embodiment, by annealing a first polysilicon layer in a nitrogen-containing ambient, such as NO, $N_2O$, and $NH_3$. Such an anneal may be carried out as an RTP anneal, a tube anneal, or otherwise. The barrier layer may also be formed by implanting a nitrogen-containing material, such as elemental or molecular nitrogen, into a first polysilicon layer. Moreover, the barrier layer may also be formed by in-situ depositing a nitrogen-doped first polysilicon layer.

By use of this invention, diffusion of dopants from the polysilicon layer overlying the gate dielectric layer may be retarded, as most dopant atoms are prevented from diffusing from the gate electrode layer at all. In addition, the nitrogen concentration within the gate dielectric layer at or near the substrate interface may be maintained at lower concentrations than otherwise necessary to prevent dopant diffusion into the underlying substrate. The present invention is particularly well suited to thin gate dielectrics, such as a those having a thickness less than approximately 60 Å when using a p-type dopant, such as boron. Such a dopant may be introduced by implanting B, $BF_2$, or by a gaseous diffusion.

In one embodiment for a semiconductor manufacturing process, a method of fabricating a gate electrode structure for an insulated gate field effect transistor includes the steps of: (1) providing a gate dielectric layer on an underlying semiconductor body; (2) forming a nitrogen-containing first gate electrode layer on the gate dielectric layer; (3) forming a second gate electrode layer on the first gate electrode layer, the first and second gate electrode layers together creating a composite gate electrode layer; (4) introducing a dopant into at least the second gate electrode layer; and (5) etching the composite gate electrode layer to form a gate electrode for the IGFET.

In another embodiment for a semiconductor manufacturing process, a method of fabricating a gate electrode structure for an insulated gate field effect transistor includes the steps of: (1) providing a gate dielectric layer on an underlying semiconductor body; (2) depositing a first polysilicon layer on the gate dielectric layer; (3) implanting a nitrogen-containing material into the first polysilicon layer; (4) forming a second polysilicon layer on the first polysilicon layer, the first and second polysilicon layers together creating a composite polysilicon layer; (5) introducing a dopant into at least the second polysilicon layer; and (6) etching the composite polysilicon layer to form a gate electrode for the IGFET.

In yet another embodiment for a semiconductor manufacturing process, a method of fabricating a gate electrode structure for an insulated gate field effect transistor includes the steps of: (1) providing a gate dielectric layer on an underlying semiconductor body; (2) depositing a first polysilicon layer on the gate dielectric layer; (3) annealing the first polysilicon layer in a nitrogen-containing ambient; (4) forming a second polysilicon layer on the first polysilicon layer, the first and second polysilicon layers together creating a composite polysilicon layer; (5) introducing a dopant into at least the second polysilicon layer; and (6) etching the composite polysilicon layer to form a gate electrode for the IGFET.

In yet another embodiment for a semiconductor manufacturing process, a method of fabricating a gate electrode structure for an insulated gate field effect transistor includes the steps of: (1) providing a gate dielectric layer on an underlying semiconductor body; (2) in situ depositing a nitrogen-doped first polysilicon layer on the gate dielectric layer; (3) forming a second polysilicon layer on the first polysilicon layer, the first and second polysilicon layers together creating a composite polysilicon layer; (4) introducing a dopant into at least the second polysilicon layer; and (5) etching the composite polysilicon layer to form a gate electrode for the IGFET.

In another embodiment of the invention, a semiconductor gate electrode structure for an insulated gate field effect transistor (IGFET) includes a gate dielectric layer formed on an underlying semiconductor body, a nitrogen-containing first gate electrode layer formed on the gate dielectric layer, and a second gate electrode layer formed on the first gate electrode layer, wherein the first and second gate electrode layers together form a composite gate electrode layer, and wherein the first gate electrode layer forms a barrier layer to retard diffusion of a dopant from the second polysilicon layer into the underlying gate dielectric layer.

BRIEF DESCRIPTION OF THE DRAWINGS

The present invention may be better understood, and its numerous objects, features, and advantages made apparent to those skilled in the art by referencing the accompanying drawings.

In the drawings, depicted elements are not necessarily drawn to scale, and like or similar elements may be designated by the same reference numeral throughout the several views.

DESCRIPTION OF THE PREFERRED EMBODIMENT(S)

Figure 1A:
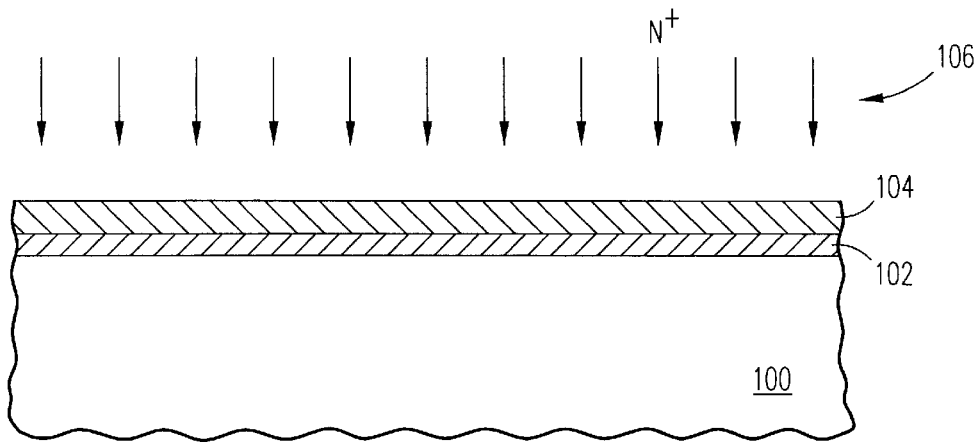
FIGS. 1A–1C are cross-sectional views illustrating a semiconductor process flow in accordance with one embodiment of the present invention.
Figure 1B:
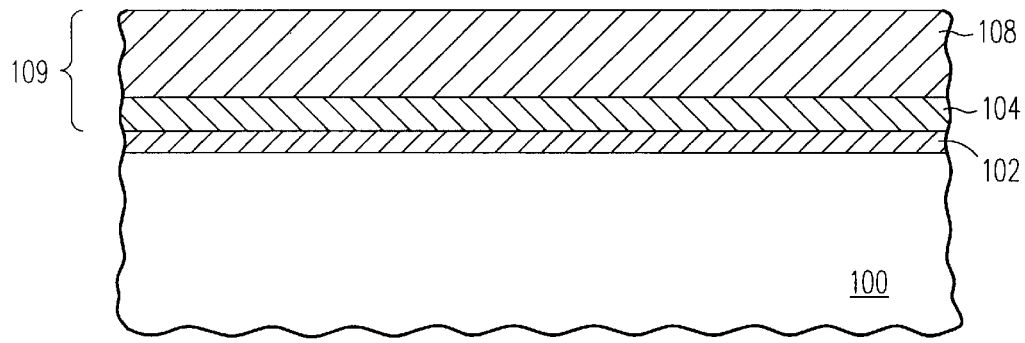
Figure 1C:
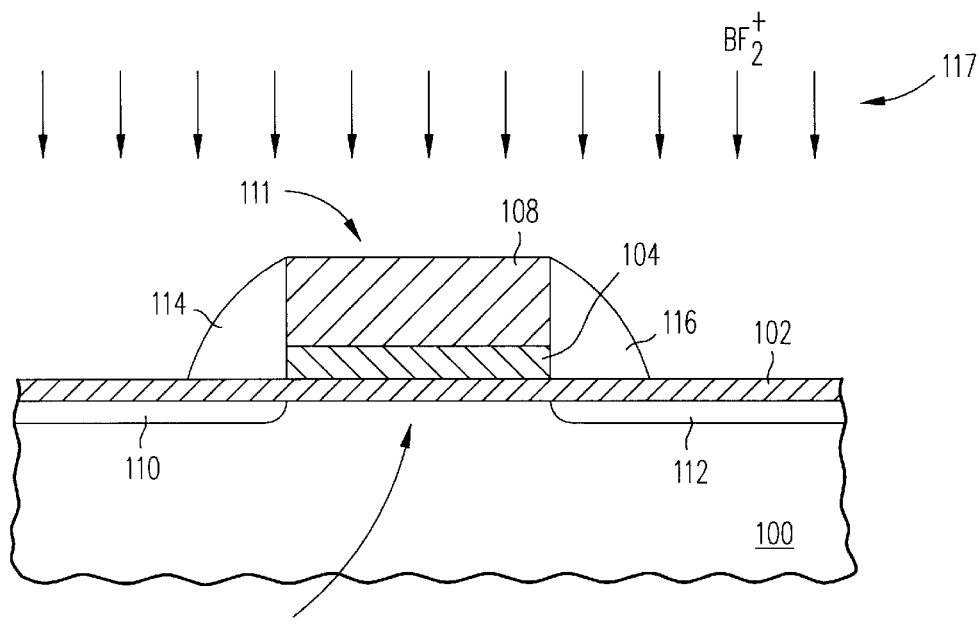

FIGS. 1A–1C show cross-sectional views of successive process steps for forming a composite gate electrode layer suitable for an insulated gate field effect transistor (IGFET) in accordance with a first embodiment of the present invention. Referring to FIG. 1A, a semiconductor substrate 100 is provided which is suitable for integrated circuit manufacture. For example, substrate 100 includes a phosphorus-doped N-well formed in a P-type planar epitaxial surface layer (not shown) with a <100> orientation and a resistivity of 12 ohm-cm. Preferably, the epitaxial surface layer is disposed on a P+ base layer (not shown). A gate dielectric layer 102 (e.g., silicon dioxide, silicon oxynitride, nitrided silicon dioxide, etc.) is formed on the top surface of substrate 100 preferably using tube growth at a temperature of 700°–1,000° C. in an $O_2$ containing ambient. Gate dielectric layer 102 has a preferred thickness in the range of 25 to 200 Å. Thereafter, a first polysilicon layer 104 is preferably deposited by low pressure chemical vapor deposition (LPCVD) on the top surface of the gate dielectric layer 102. Polysilicon layer 104 is deposited undoped and has a preferred thickness in the range of approximately 100–500 Å.

Continuing with the exemplary process sequence, a nitrogen implant 106 is performed to dope the first polysilicon layer 104 with nitrogen. Preferably $N_2$ is implanted at an energy within the range of 1–5 keV and at a dose in the range of $2 \times 10^{14}$–$4 \times 10^{16}$ atoms/$cm^2$. Thereafter, a second polysilicon layer 108 is preferably LPCVD deposited on the top surface of the first polysilicon layer 104. Second polysilicon layer 108 is deposited undoped and has a preferred thickness in the range of approximately 300–2000 Å. The resulting structure is shown in FIG. 1B. First polysilicon layer 104 and second polysilicon layer 108 together form a composite gate electrode layer 109.

Continuing with the process sequence, a photoresist layer (not shown) is next applied and a gate mask used to image the gate electrode features into the photoresist. The second polysilicon layer 108 and first polysilicon layer 104 are then anisotropically etched to define a gate electrode 111. A light dose of a first dopant (e.g., boron) is implanted (not shown) into the semiconductor substrate 100 to provide a lightly doped source region 110 and lightly doped drain region 112, and to lightly dope the second polysilicon layer 108 within the gate electrode 111. For example, the structure is subjected to ion implantation of boron or $BF_2$ at a dose in the range of $5\times10^{13}$ to $1\times10^{14}$ atoms/cm$^2$ and an energy in the range of 2 to 80 kiloelectron-volts. As a result, the lightly doped source region 110 and the lightly doped drain region 112, both substantially aligned with the gate electrode 120, are formed at and below the surface of substrate 100 and are doped P− with a dopant concentration in the range of about $5\times10^{17}$ to $5\times10^{18}$ atoms/cm$^3$. The second polysilicon layer 108 within the gate electrode 111 is doped to a concentration of approximately $10^{17}$–$10^{19}$ atoms/cm$^3$. Spacers are then formed at the edges of the gate electrode 111. The resulting structure is shown in FIG. 1C, which shows spacers 114, 116 formed adjacent to the gate electrode 120, and shows lightly-doped source/drain regions 110, 112 formed within the substrate 100.

Continuing with the process sequence, a heavy boron implant 117 is next performed to form P+ source and drain regions (not shown) and to heavily dope the gate electrode 111. The P+ source and drain regions are formed within the substrate 100 and outward of the spacers 114, 116, as is well known in the art. For example, the boron implant 117 may be a $BF_2$ implant performed at a dose in the range of $1\times10^{15}$–$5\times10^{15}$ atoms/cm$^2$ and an energy in the range of 5–60 keV. The presence of spacers 114, 116 and the gate electrode 111 serve to prevent the boron implant 117 from reaching the channel 101 underlying the gate electrode 111 and from reaching the lightly doped source and drain regions 110,112.

Further processing steps in the fabrication of IGFETs typically include forming a thick oxide layer over the active regions, forming contact windows in the oxide layer above the drain, source and gate electrode, forming appropriate interconnect metallization in the contact windows, and forming a passivation layer. These further processing steps are conventional and need not be repeated herein. Likewise the principal processing steps disclosed herein may be combined with other steps readily apparent to those skilled in the art.

Figure 4:
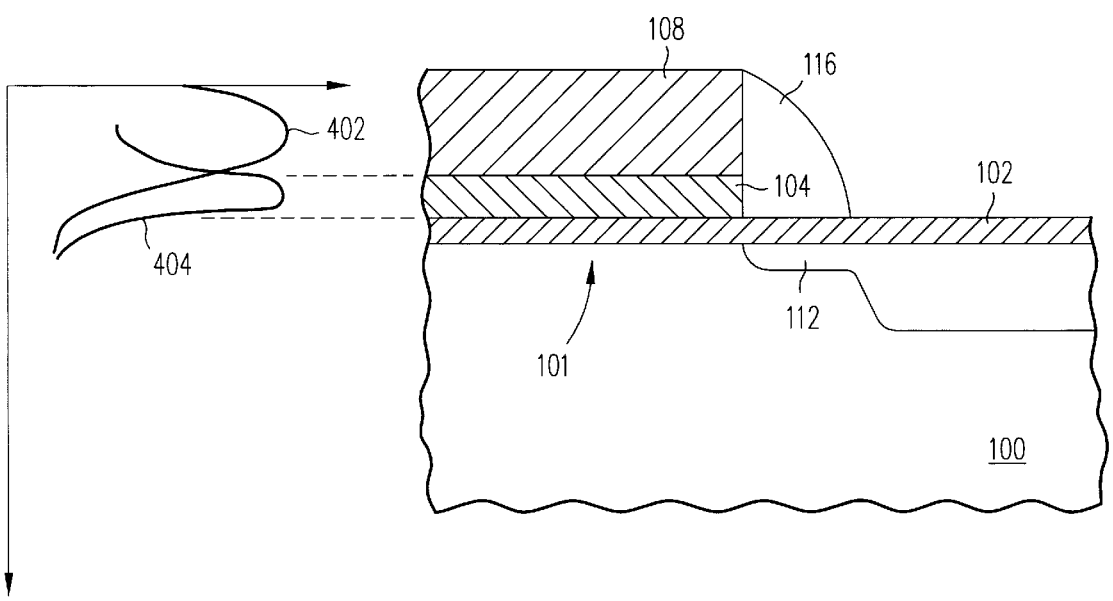
FIG. 4 is a cross-sectional view illustrating a doping profile achievable using the process of FIGS. 1A–1C.

The resulting doping profile within the gate electrode 111 as a result of the described processing steps is shown in FIG. 4. The bulk of the boron dopant is preferably implanted into the second polysilicon layer 108, as indicated by the boron doping profile 402, with only a minor portion implanted into the first polysilicon layer 104. The nitrogen concentration within the first polysilicon layer 104 (as indicated by the nitrogen doping profile 404) forms a barrier layer which retards the diffusion of boron from the second polysilicon layer 108 into the gate dielectric layer 102. Through subsequent heat treatment operations (e.g., implant anneal steps) this barrier layer retards the downward diffusion of the boron from the gate electrode 111 and helps prevent boron from reaching the gate dielectric layer 102.

Moreover, even though only a small amount of the boron is initially preferably implanted into the first polysilicon layer 104, the barrier layer formed by the nitrogendoped first polysilicon layer 104 also inhibits the downward diffusion of boron which may have likewise been implanted into the first polysilicon layer 104. Through subsequent heat treatment operations (e.g., implant anneal steps) the barrier layer retards the downward diffusion of the boron and helps prevent boron from reaching the gate dielectric layer 102.

In another embodiment of the present invention, a composite gate electrode layer may be formed by implanting nitrogen through a displacement layer and into the first polysilicon layer. The displacement layer is then removed, and a second polysilicon layer is subsequently deposited thereupon. Such a technique allows the use of a higher energy nitrogen implantation step than described above.

Figure 2A:
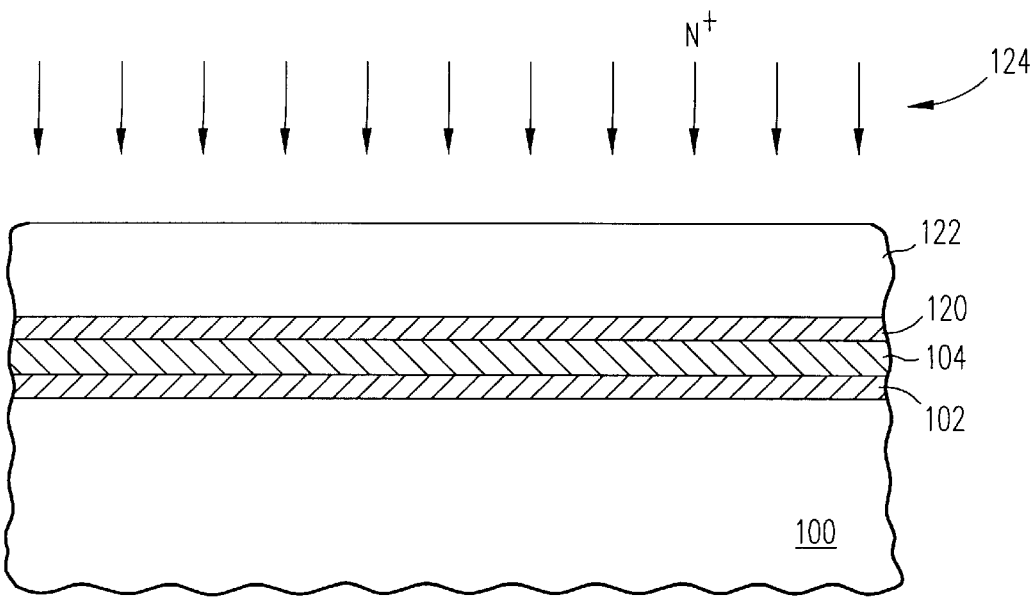
FIGS. 2A–2B are cross-sectional views illustrating a semiconductor process flow in accordance with another embodiment of the present invention.
Figure 2B:
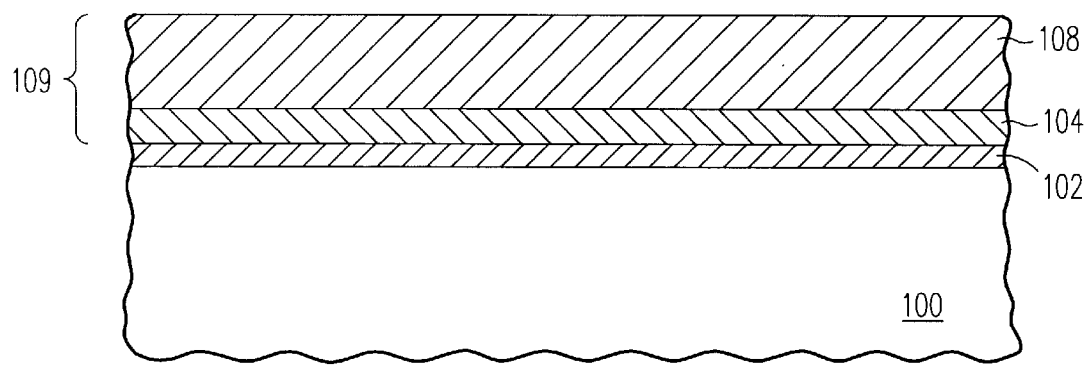

Referring now to FIGS. 2A–2B, a substrate 100, gate dielectric 102, and first polysilicon layer 104 are shown, as before. An oxide layer 120, having a preferred thickness of 30–50 Å, is formed on the top surface of the first polysilicon layer 104, and a displacement layer 122 (e.g., an additional polysilicon layer, photoresist, or an additional oxide layer) is formed, having a preferred thickness of 1000–3000 Å, on the top surface of the oxide layer 120. A nitrogen implant 124 is then performed to dope the first polysilicon layer 104 with nitrogen. Preferably $N_2$ is implanted at an energy within the range of 1–5 keV and at a dose in the range of $2\times10^{14}$–$2\times10^{16}$ atoms/cm$^2$. The implanted nitrogen may be optionally annealed using either a tube anneal or RTA anneal method. Preferred conditions for such an anneal is 900°–1050° C. The displacement layer 122 and the oxide layer 120 are then both removed by suitable etching techniques to expose the top surface of the first polysilicon layer 104. Thereafter, the second polysilicon layer 108 is preferably LPCVD deposited on the exposed top surface of the first polysilicon layer 104, as before. The resulting structure is shown in FIG. 2B. First polysilicon layer 104 and second polysilicon layer 108 together form the composite gate electrode layer 109, as before. Further processing steps in the fabrication of the IGFET proceed as described above, and need not be repeated. Additional displacement layer implantation techniques are disclosed in the U.S. Patent Application entitled "Ion Implantation into a Gate Electrode Layer Using an Implant Profile Displacement Layer" previously incorporated by reference herein.

Figure 3A:
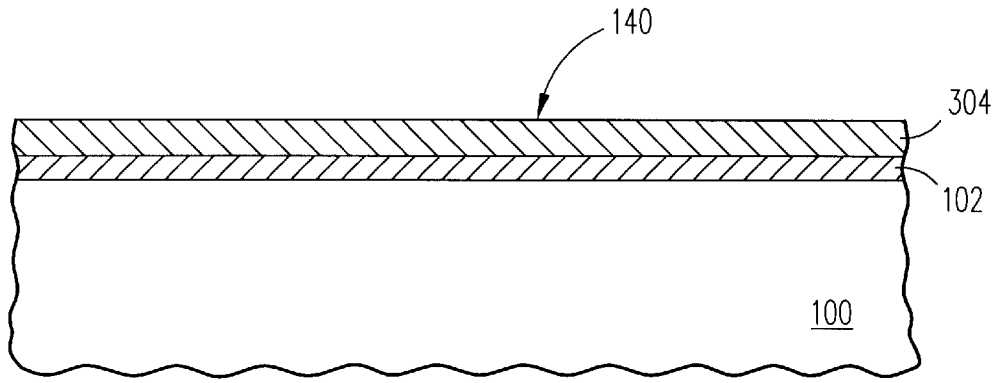
FIGS. 3A–3C are cross-sectional views illustrating a semiconductor process flow in accordance with yet another embodiment of the present invention.
Figure 3B:
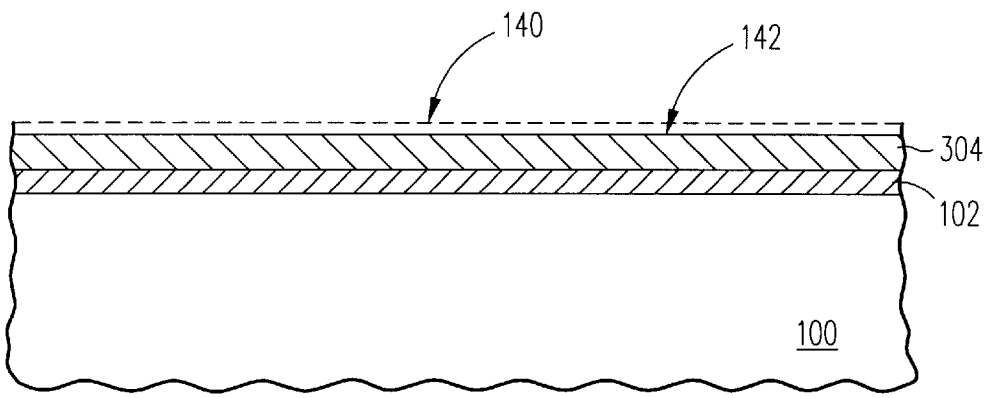
Figure 3C:
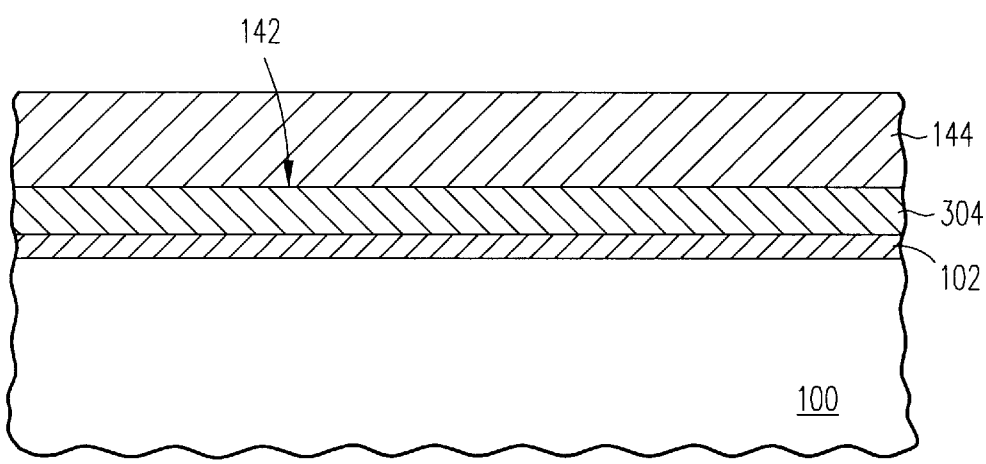

In yet another embodiment of the present invention, a composite gate electrode layer may be formed by annealing a first polysilicon layer in a nitrogen-containing ambient, and subsequently depositing a second polysilicon layer thereupon. Referring now to FIGS. 3A–3C, a substrate 100 and a gate dielectric 102 are shown, as before. A first polysilicon layer 304 is preferably deposited to a thickness within the range of 50–200 Å.

Continuing with the process sequence, a nitrogen anneal is performed to create a high nitrogen concentration within the first polysilicon layer 304, and which forms the diffusion-retarding barrier layer near what will become the bottom surface of the composite gate electrode layer. For this embodiment, the barrier layer is composed of a nitrided layer created within the first polysilicon layer 304 by the nitrogen anneal. Such an anneal may be performed using a rapid thermal processing (RTP) step, using a tube anneal, using a combination of both, or other similar methods, and is performed using a nitrogen-containing ambient, such as NO, $N_2$, $N_2O$, and $NH_3$. For example, an RTP anneal may be performed for a time in the range of 10–60 seconds at a temperature in the range of 900°–1050° C. By using a gaseous source of nitrogen dopant, high doses of nitrogen are more easily achievable in the first polysilicon layer 304. But by performing the nitrogen doping prior to formation of the second polysilicon layer 144, the nitrogen remains tightly concentrated near the bottom of the composite gate electrode layer (adjacent to the gate dielectric interface).

Continuing with the process sequence, a short etch may be performed to remove any insulating surface layer created by the annealing operation on the first polysilicon layer 304.

For example, if NO is used to anneal the first polysilicon layer 304, an insulating nitride layer is formed at the top surface 140, which may be removed by a 30 second dip etch in 10:1 HF. This etch thins the first polysilicon layer slightly and exposes an etched top surface 142. A second polysilicon layer 108 is then deposited on the etched top surface 142 of the first polysilicon layer 304. The resulting structure is shown in FIG. 3C. Polysilicon layer 108 is preferably formed with a thickness in the range of 300–2500 Å.

In another embodiment generally following the sequence depicted in FIG. 1A–1C, the first polysilicon layer 104 may be both formed and doped simultaneously with a high concentration of nitrogen. Suitable conditions for such a depositing step are an ambient of silane and NO or $N_2O$ at 550° C. In this example, the first polysilicon layer 104 is preferably formed to a thickness of approximately 20 Å. Nitrogen concentrations as high as $1\times10^{21}$ atoms/cm$^3$ are achievable within the first polysilicon layer 104.

By use of this invention, the gate dielectric layer may be reduced down to approximately 25 Å, without significant concentration of boron reaching the gate dielectric. Excellent dopant concentration is achievable within a polysilicon gate electrode, even substantially adjacent to the gate dielectric/polysilicon interface, without substantial boron penetration into the gate dielectric layer (e.g., gate oxide). Consequently, tradeoffs between polysilicon depletion effects and boron penetration are reduced.

Although only a single FET has been shown for purposes of illustration, it is understood that in actual practice, many devices are fabricated on a single semiconductor wafer as widely practiced in the art. Accordingly, the invention is well-suited for use in an integrated circuit chip, as well as an electronic system including a microprocessor, a memory, and a system bus.

Those skilled in the art will readily implement the steps necessary to provide the structures and methods disclosed herein, and will understand that the process parameters, materials, and dimensions are given by way of example only and can be varied to achieve the desired structure as well as modifications which are within the scope of the invention.

In a typical embodiment for a CMOS process the N-channel transistors are processed in like manner as the P-channel transistor discussed above, except that an n-type dopant atom (e.g., arsenic) is implanted to form the N-channel source/drain regions. As is well known in the art, the P-channel transistors may be masked with photoresist during the n-type source/drain implant step, which photoresist serves to prevent the n-type dopant from reaching the P-channel gate, channel, and source/drain regions. Likewise, the p-type implanting step for the P-channel source/drain regions is performed while the N-channel IGFETs are protected. Consequently, barrier layers may be advantageously formed, if desired, only within the gate electrode of P-channel IGFETs which have greater dopant diffusion than N-channel IGFETs.

Although IGFET transistors are frequently discussed as having a drain, a gate, and a source, in many such devices the drain is interchangeable with the source. It should be noted that IGFET transistors are commonly referred to as MOSFET transistors (which literally is an acronym for "Metal-Oxide-Semiconductor Field Effect Transistor"), even though the gate material may be polysilicon or some material other than metal, and the dielectric may be oxynitride, nitride, or some material other than oxide. The casual use of such historical legacy terms as MOSFET should not be interpreted to literally specify a metal gate FET having an oxide dielectric.

While the invention has been largely described with respect to the embodiments set forth above, the invention is not necessarily limited to these embodiments. Variations and modifications of the embodiments disclosed herein may be made based on the description set forth herein, without departing from the scope and spirit of the invention as set forth in the following claims. For example, the invention is not necessarily limited to any particular transistor process technology, or to any particular layer thickness or composition. Moreover, while gate dielectrics are commonly formed of silicon dioxide, such a gate dielectric layer 102 in the above embodiments may be formed of a silicon oxynitride, a silicon nitride, or any other suitable insulating material which may be formed in an appropriate thickness. Moreover, while the embodiments have been described in the context of a P-channel IGFET formed within an N-well disposed within a P– epitaxial layer atop a P+ substrate, it should be appreciated that such detailed process descriptions are equally applicable for N-channel IGFET fabrication.

Dopants may be introduced into the polysilicon layers by ion implantation or by gaseous diffusion. A boron implant step may utilize B, BF, $BF_2$, or any other source containing boron atoms such as $BF_x$, and any nitrogen implant step described may utilize atomic nitrogen (N), molecular nitrogen ($N_2$), or any other source containing nitrogen atoms. A given implant may be restricted to forming a corresponding layer within a certain region (for example, such as a P-channel gate electrode) and excluding other regions (for example, such as an N-channel gate electrode). As another example, a given implant step described above may be performed using two different implant operations, each at a different energy, to achieve a wider doping profile than achievable using a single implant. Accordingly, other embodiments, variations, and improvements not described herein are not necessarily excluded from the scope of the invention, which is defined by the following appended claims.

What is claimed is:

1. In a semiconductor manufacturing process, a method of fabricating a gate electrode structure for an insulated gate field effect transistor (IGFET), said method comprising the steps of:

providing a gate dielectric layer on an underlying semiconductor body;

forming a nitrogen-containing first gate electrode layer on the gate dielectric layer;

forming a second gate electrode layer on the first gate electrode layer, said first and second gate electrode layers together creating a composite gate electrode layer;

introducing a dopant into at least the second gate electrode layer; and etching the composite gate electrode layer to form a gate electrode for the IGFET.

2. A method as in claim 1 wherein the composite gate electrode layer etching step is performed before the dopant introducing step.

3. A method as in claim 1 wherein the first gate electrode layer comprises a polysilicon layer.

4. A method as in claim 1 wherein the dopant comprises boron.

5. A method as in claim 1 wherein the first gate electrode layer forming step comprises the steps of:

depositing a first polysilicon layer; and implanting nitrogen into the first polysilicon layer.

6. A method as in claim 1 wherein the first gate electrode layer forming step comprises the steps of:

depositing a first polysilicon layer; and annealing the first polysilicon layer in a nitrogen-containing ambient.

7. A method as in claim 1 wherein the first gate electrode layer forming step comprises the step of:

in-situ depositing a nitrogen-doped polysilicon layer.

8. In a semiconductor manufacturing process, a method of fabricating a gate electrode structure for an insulated gate field effect transistor (IGFET), said method comprising the steps of:

providing a gate dielectric layer on an underlying semiconductor body;

depositing a first polysilicon layer on the gate dielectric layer;

implanting a nitrogen-containing material into the first polysilicon layer;

forming a second polysilicon layer on the first polysilicon layer, said first and second polysilicon layers together creating a composite polysilicon layer;

introducing a dopant into at least the second polysilicon layer; and etching the composite polysilicon layer to form a gate electrode for the IGFET.

9. A method as in claim 8 wherein nitrogen introduced by the implanting step and disposed, as a result of subsequent processing steps, in the gate dielectric layer just below the first polysilicon layer has a concentration of less than approximately 2 atomic percent.

10. A method as in claim 9 wherein said nitrogen concentration just below the first polysilicon layer is negligible.

11. A method as in claim 8 wherein the first polysilicon layer is formed to a thickness between approximately 100 Å and 500 Å.

12. A method as in claim 11 wherein the etching step is performed before the dopant introducing step.

13. A method as in claim 8 further comprising the step of:

annealing the nitrogen-containing material after the implanting step.

14. A method as in claim 8 wherein the dopant is boron.

15. In a semiconductor manufacturing process, a method of fabricating a gate electrode structure for an insulated gate field effect transistor (IGFET), said method comprising the steps of:

providing a gate dielectric layer on an underlying semiconductor body;

depositing a first polysilicon layer on the gate dielectric layer;

annealing the first polysilicon layer in a nitrogen-containing ambient;

forming a second polysilicon layer on the first polysilicon layer, said first and second polysilicon layers together creating a composite polysilicon layer;

introducing a dopant into at least the second polysilicon layer; and etching the composite polysilicon layer to form a gate electrode for the IGFET.

16. A method as in claim 15 wherein nitrogen introduced by the annealing step and disposed, as a result of subsequent processing steps, in the gate dielectric layer just below the first polysilicon layer has a concentration of less than approximately 2 atomic percent.

17. A method as in claim 16 wherein said nitrogen concentration just below the first polysilicon layer is negligible.

18. A method as in claim 15 wherein the nitrogen-containing ambient is chosen from the group consisting of $N_2$, NO, $N_2O$, and $NH_3$.

19. A method as in claim 15 wherein the first polysilicon layer is formed to a thickness between approximately 100 Å and 500 Å.

20. A method as in claim 19 wherein the etching step is performed before the dopant introducing step.

21. A method as in claim 15 wherein the dopant is boron.

22. In a semiconductor manufacturing process, a method of fabricating a gate electrode structure for an insulated gate field effect transistor (IGFET), said method comprising the steps of:

providing a gate dielectric layer on an underlying semiconductor body;

in situ depositing a nitrogen-doped first polysilicon layer on the gate dielectric layer;

forming a second polysilicon layer on the first polysilicon layer, said first and second polysilicon layers together creating a composite polysilicon layer;

introducing a dopant into at least the second polysilicon layer; and etching the composite polysilicon layer to form a gate electrode for the IGFET.

23. A method as in claim 22 wherein nitrogen introduced by the in-situ depositing step and disposed, as a result of subsequent processing steps, in the gate dielectric layer just below the first polysilicon layer has a concentration of less than approximately 2 atomic percent.

24. A method as in claim 23 wherein said nitrogen concentration just below the first polysilicon layer is negligible.

25. A method as in claim 22 wherein the first polysilicon layer is formed to a thickness between approximately 100 Å and 500 Å.

26. A method as in claim 25 wherein the etching step is performed before the dopant introducing step.

27. A method as in claim 22 wherein the dopant is boron.

* * * * *